US00RE47804E

(19) United States
(12) Reissued Patent
Ono

(10) Patent Number: US RE47,804 E
(45) Date of Reissued Patent: Jan. 7, 2020

(54) LUMINESCENT DISPLAY DEVICE

(71) Applicant: JOLED INC., Tokyo (JP)

(72) Inventor: Shinya Ono, Osaka (JP)

(73) Assignee: JOLED INC., Tokyo (JP)

(21) Appl. No.: 16/145,623

(22) Filed: Sep. 28, 2018

Related U.S. Patent Documents

Reissue of:
(64) Patent No.: 9,461,102
Issued: Oct. 4, 2016
Appl. No.: 13/012,294
Filed: Jan. 24, 2011

U.S. Applications:
(63) Continuation of application No. PCT/JP2009/006415, filed on Nov. 27, 2009.

(51) Int. Cl.

| | |
|---|---|
| ***G09G 3/22*** | (2006.01) |
| ***G09G 3/32*** | (2016.01) |
| ***H01L 27/32*** | (2006.01) |
| ***H01L 27/12*** | (2006.01) |
| ***G09G 3/3233*** | (2016.01) |

(52) U.S. Cl.
CPC ..... *H01L 27/3265* (2013.01); *G09G 3/3233* (2013.01); *H01L 27/1255* (2013.01)

(58) Field of Classification Search
CPC ..... H01L 27/3265; H01L 27/1255; G09G 3/3233
See application file for complete search history.

(56) References Cited

U.S. PATENT DOCUMENTS 6,509,688 B1 * 1/2003 Bae ..... G09G 3/32 257/E27.111
6,599,786 B1 * 7/2003 Ahn ..... H01L 27/1255 257/E27.111
7,378,739 B2 5/2008 Kwak et al.
(Continued)

FOREIGN PATENT DOCUMENTS

JP 2005-340772 12/2005
JP 2005-340772 A 12/2005
(Continued)

OTHER PUBLICATIONS

Japan Office Action in Japanese Patent Appl. No. 2011-008286, dated Nov. 5, 2013.
(Continued)

*Primary Examiner* — Adam L Basehoar
(74) *Attorney, Agent, or Firm* — Greenblum & Bernstein, P.L.C.

(57) ABSTRACT

A luminescent display device includes a substrate and a thin-film transistor above the substrate. The thin-film transistor includes a semiconductor layer, a gate insulating film on the semiconductor layer, a gate electrode on the gate insulating film, a source electrode, and a drain electrode. The luminescent display device further includes an interlayer insulating film on the gate electrode, a first capacitor electrode on the interlayer insulating film in a region above the gate electrode, and a luminescent element configured to be driven by a driver to produce luminescence. The driver includes the thin-film transistor, and the first capacitor electrode and the gate electrode constitute a capacitor.

28 Claims, 14 Drawing Sheets

(56) References Cited

U.S. PATENT DOCUMENTS

| | | | | |
|---|---|---|---|---|
| 7,642,559 | B2 | 1/2010 | Yamazaki et al. | |
| 7,652,291 | B2 | 1/2010 | Koo et al. | |
| 7,671,368 | B2 | 3/2010 | Kwak et al. | |
| 7,701,134 | B2 | 4/2010 | Yamazaki et al. | |
| 7,723,721 | B2 | 5/2010 | Udagawa et al. | |
| 7,741,775 | B2 | 6/2010 | Yamazaki et al. | |
| 7,863,612 | B2 | 1/2011 | Sato | |
| 7,872,264 | B2 | 1/2011 | Kubota et al. | |
| 8,159,420 | B2 | 4/2012 | Takahashi et al. | |
| 8,198,636 | B2 | 6/2012 | Kubota et al. | |
| 8,227,809 | B2 | 7/2012 | Yamazaki et al. | |
| 9,093,409 | B2 * | 7/2015 | Ono | H01L 27/3265 |
| 2003/0089905 | A1 | 5/2003 | Udagawa et al. | |
| 2003/0141811 | A1 * | 7/2003 | Park et al. | 313/506 |
| 2004/0065902 | A1 | 4/2004 | Yamazaki et al. | |
| 2005/0161672 | A1 | 7/2005 | Yamazaki et al. | |
| 2005/0258466 | A1 | 11/2005 | Kwak et al. | |
| 2005/0275352 | A1 * | 12/2005 | Sun | 315/169.3 |
| 2006/0097256 | A1 | 5/2006 | Yamazaki et al. | |
| 2006/0097966 | A1 * | 5/2006 | Choi | 345/77 |
| 2006/0192205 | A1 | 8/2006 | Yamazaki et al. | |
| 2006/0267491 | A1 | 11/2006 | Koo et al. | |
| 2007/0040772 | A1 | 2/2007 | Kim | |
| 2008/0017860 | A1 | 1/2008 | Kubota et al. | |
| 2008/0017866 | A1 | 1/2008 | Sato | |
| 2008/0099760 | A1 | 5/2008 | Fujimori et al. | |
| 2008/0217624 | A1 | 9/2008 | Kwak et al. | |
| 2008/0246403 | A1 | 10/2008 | Sagawa et al. | |
| 2008/0309653 | A1 | 12/2008 | Takahashi et al. | |
| 2009/0047775 | A1 | 2/2009 | Yamazaki et al. | |
| 2010/0090205 | A1 * | 4/2010 | Ofuji | H01L 27/3265 257/40 |
| 2010/0224868 | A1 | 9/2010 | Udagawa et al. | |
| 2010/0253710 | A1 * | 10/2010 | Rankov et al. | 345/690 |
| 2010/0295758 | A1 | 11/2010 | Kawabe | |
| 2010/0302221 | A1 | 12/2010 | Okumoto | |
| 2011/0068707 | A1 | 3/2011 | Kubota et al. | |
| 2012/0199871 | A1 | 8/2012 | Kubota et al. | |
| 2012/0299471 | A1 | 11/2012 | Yamazaki et al. | |
| 2017/0141177 | A1 * | 5/2017 | Kim | G09G 3/3291 |

FOREIGN PATENT DOCUMENTS

| | | | |
|---|---|---|---|
| JP | 2006-330736 | | 12/2006 |
| JP | 2006-330736 | A | 12/2006 |
| JP | 2007-226184 | | 9/2007 |
| JP | 2008-046619 | | 2/2008 |
| JP | 2008-46619 | A | 2/2008 |
| JP | 2008-107785 | | 5/2008 |
| JP | 2008-112895 | | 5/2008 |
| JP | 2008-235912 | | 10/2008 |
| JP | 2008-235912 | A | 10/2008 |
| JP | 2008-257086 | | 10/2008 |
| JP | 2008-257086 | A | 10/2008 |
| JP | 2009-071285 | | 4/2009 |
| JP | 2009-139851 | | 6/2009 |
| JP | 2009-157133 | | 7/2009 |
| JP | 2009-200336 | | 9/2009 |
| JP | 2009-200336 | A | 9/2009 |
| JP | 2009-218223 | | 9/2009 |
| JP | 2009-271188 | | 11/2009 |

OTHER PUBLICATIONS

U.S.A. (U.S. Appl. No. 14/290,104) Office action, dated Dec. 19, 2014.

International Search Report in PCT/JP2009/006415, dated Dec. 22, 2009.

Office Action in JP 2010-521255, dated Feb. 22, 2011.

Japan Office Action mail date is Nov. 5, 2013.

* cited by examiner

AMENDED

LUMINESCENT DISPLAY DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATION

[This is a continuation application of PCT Application No. PCT/JP2009/006415, filed on Nov. 27, 2009, designating the United States of America, the disclosure of which, including the specification, drawings, and claims, is incorporated herein by reference in its entirety.] *NOTICE: More than one reissue application has been filed for the reissue of U.S. Pat. No. 9,461,102 B2. Reissue Application Ser. No. 16/145,623 is a reissue of U.S. Pat. No. 9,461,102 B2 and was filed on Sep. 28, 2018. Reissue Appl. Ser. No. 16/671,675 is a reissue of U.S. Pat. No. 9,461,102 B2, was filed on Nov. 1, 2019, and is a continuation reissue application of Reissue application Ser. No. 16/145,623.*

BACKGROUND OF THE INVENTION

1. Field of the Invention

The present invention relates to luminescent display devices, and particularly to an active-matrix luminescent display device which includes a luminescent element and a driving circuit having a capacitor and a thin-film transistor.

2. Description of the Related Art

Conventionally, there is an active development of luminescent display devices, such as organic electroluminescent elements (hereinafter abbreviated as organic EL elements), in which luminescent elements that control the luminance using an electric current are two-dimensionally arranged. In particular, there is an ongoing development of active-matrix luminescent display devices in which pixel circuits are arranged which include, for each luminescent element, a driving circuit for driving the luminescent element.

The driving circuit generally includes: a switching transistor which selects a pixel for producing luminescence; a driving transistor which drives a luminescent element; and a capacitor. The driving circuit includes, for example, a capacitor which holds a voltage for determining an amount of a current passed by the driving transistor (see Patent Literature 1: Japanese Unexamined Patent Application Publication No. 2006-330736).

FIG. 1 shows the layout of a luminescent pixel 700 included in a conventional luminescent display device disclosed in Patent Literature 1. As shown in FIG. 1, the luminescent pixel 700 is wired with a signal line 705, a scanning line 706, and a power line 707. Further, the luminescent pixel 700 includes a switching transistor 701, a capacitor 702, a driving transistor 703, and a luminescent element 704. The luminescent element 704 is formed in the luminescent region of the luminescent pixel 700, whereas the switching transistor 701, the capacitor 702, and the driving transistor 703 are formed in the driving circuit region.

SUMMARY OF THE INVENTION

With the above conventional technique, however, a region dedicated to the capacitor is formed, thereby causing a problem that when the number of capacitors or the capacitor area increases, the region for forming other elements becomes smaller, resulting in less design flexibility.

For example, as in the luminescent display device of Patent Literature 1 shown in FIG. 1, most of the driving circuit region is occupied by the capacitor 702. Therefore, in the case of forming a capacitor 702 which occupies a larger area or in the case of forming another capacitor, the region for forming the driving transistor 703 and the switching transistor 701 becomes smaller. Alternatively, the luminescent region becomes smaller, leading to an increase in the density of the current flowing in the luminescent element, thereby reducing the lifetime of the luminescent element.

In view of the above, the present invention has been conceived to solve the above conventional problem, and it is an object of the present invention to provide a luminescent display device with higher design flexibility by forming a capacitor without a region dedicated to the capacitor or a new region dedicated to the capacitor.

In order to achieve the above object, the luminescent display device according to an aspect of the present invention is a luminescent display device including: a substrate; a thin-film transistor which is formed above the substrate and includes: a semiconductor layer having a channel region, a source region, and a drain region; a gate insulating film formed on the semiconductor layer; a gate electrode formed on the gate insulating film; and a source electrode and a drain electrode which are electrically connected to the source region and the drain region of the semiconductor layer, respectively; an interlayer insulating film formed on the gate electrode; a luminescent element which is driven by a driving circuit to produce luminescence, the driving circuit including the thin-film transistor; and a first capacitor electrode formed on the interlayer insulating film in a region above the gate electrode, wherein the first capacitor electrode and the gate electrode constitute a first capacitor.

According to the present invention, it is possible to provide a luminescent display device with higher design flexibility by forming a capacitor without a region dedicated to the capacitor or a new region dedicated to the capacitor.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Figure 1:
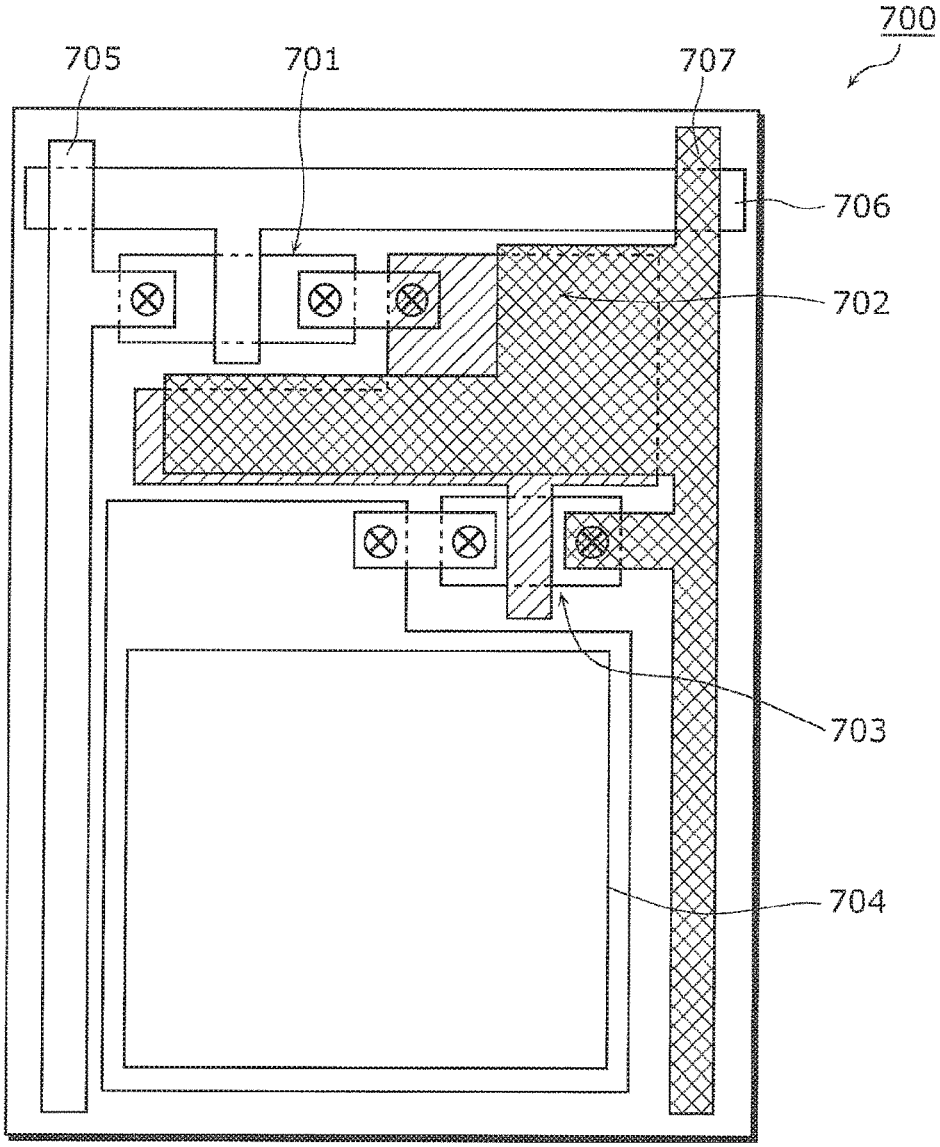
PRIOR ART FIG. 1
FIG. 1 shows the layout of a pixel included in a conventional luminescent display device.

Hereinafter, embodiments of the luminescent display device according to the present invention are described with reference to the drawings.

The luminescent display device according to an aspect of the present invention is a luminescent display device including: a substrate; a thin-film transistor which is formed above the substrate and includes: a semiconductor layer having a channel region, a source region, and a drain region; a gate insulating film formed on the semiconductor layer; a gate electrode formed on the gate insulating film; and a source electrode and a drain electrode which are electrically connected to the source region and the drain region of the semiconductor layer, respectively; an interlayer insulating film formed on the gate electrode; a luminescent element which is driven by a driving circuit to produce luminescence, the driving circuit including the thin-film transistor; and a first capacitor electrode formed on the interlayer insulating film in a region above the gate electrode, wherein the first capacitor electrode and the gate electrode constitute a first capacitor.

With this, the gate electrode of the thin-film transistor is used not only simply as the gate electrode but also as one of two electrodes constituting the capacitor. Thus, the capacitor can be formed above the thin-film transistor to overlap with the thin-film transistor, enabling efficient use of the pixel space. As a result, a complex driving circuit which includes multiple thin-film transistors and multiple capacitors can be formed in a region having a limited area. It is to be noted that the structure of the present invention can be applied to a capacitor for holding the gate voltage, as well as a capacitor for holding a threshold voltage Vth in the driving circuit.

Further, the luminescent display device may include a plurality of first capacitor electrodes including the first capacitor electrode, wherein each of the plurality of first capacitor electrodes and the gate electrode may constitute the first capacitor.

Furthermore, the first capacitor electrode and one of the source electrode and the drain electrode may form one layer, and the one of the source electrode and the drain electrode may be electrically connected to the first capacitor electrode.

With this, the other one of the two electrodes constituting the capacitor and one of the source electrode and the drain electrode can be formed in one process.

Moreover, the luminescent element may be electrically connected to one of the source electrode and the drain electrode, the thin-film transistor may be a driving transistor which supplies a driving current to the luminescent element, and the first capacitor may be a capacitor for setting a value of a current flowing in the driving transistor.

This makes it possible to form, in the driving circuit, the capacitor for setting the value of the driving current flowing in the driving transistor, while efficiently using the pixel space.

Further, the thin-film transistor may be a switching transistor which determines timing of supplying a driving current to the luminescent element, and the first capacitor may be a capacitor for initializing a capacitor used for setting a value of the driving current.

With this, one of the capacitor electrodes of the capacitor can be used also as, not only the gate electrode of the driving transistor, but also the gate electrode of the switching transistor. Therefore, it is possible to arrange a greater number of thin-film transistors and capacitors by efficiently using the limited pixel space.

Furthermore, the luminescent display device may further include a second capacitor, wherein the second capacitor may be electrically connected to the first capacitor in parallel.

With this, in addition to the first capacitor, the second capacitor is also formed in parallel, making it possible to increase the capacitance by the capacitance of the second capacitor.

Further, the second capacitor may include an upper second capacitor electrode and a lower second capacitor electrode, one of the upper second capacitor electrode and the lower second capacitor electrode may be electrically connected to the gate electrode, and the other one of the upper second capacitor electrode and the lower second capacitor electrode may be electrically connected to one of the source electrode and the drain electrode.

This makes it possible to increase the capacitance by the capacitance of the second capacitor, allowing for stability in the voltage even when there is a leak current, and thus crosstalk can be reduced.

Furthermore, the upper second capacitor electrode and one of the source electrode and the drain electrode may form one layer, the lower second capacitor electrode and the gate electrode may form one layer, and the first capacitor electrode may be electrically connected to the upper second capacitor electrode and to one of the source electrode and the drain electrode.

This makes it possible to form, as one layer, first ones of the capacitor electrodes constituting the first capacitor and the second capacitor, and to form, as another layer, second ones of the capacitor electrodes constituting the first capacitor and the second capacitor, thereby enabling reduction in the number of manufacturing processes.

Moreover, an area of a lower surface of the first capacitor electrode, which is part of the first capacitor, in the region above the gate electrode may be 30% to 100% of an area of an upper surface of the gate electrode.

Further, the semiconductor layer may be made of polysilicon.

Furthermore, the luminescent element may be an organic electroluminescent element.

Furthermore, a capacitance of the first capacitor may be 0.1 to 10 pF.

Moreover, the luminescent display device may be a top-emission luminescent display device, and the luminescent element may be formed in a layer above the first capacitor electrode.

Moreover, the luminescent display device may be a bottom-emission luminescent display device, and the thin-film transistor and the first capacitor may be formed in a region other than a luminescent region in which the luminescent element is formed.

Embodiment 1

The luminescent display device according to Embodiment 1 includes a driving transistor and a capacitor, and the gate electrode of the driving transistor is one of two capacitor electrodes constituting the capacitor. Thus, the capacitor is formed in a region which is above the driving transistor and which includes the gate electrode of the driving transistor.

Figure 2:
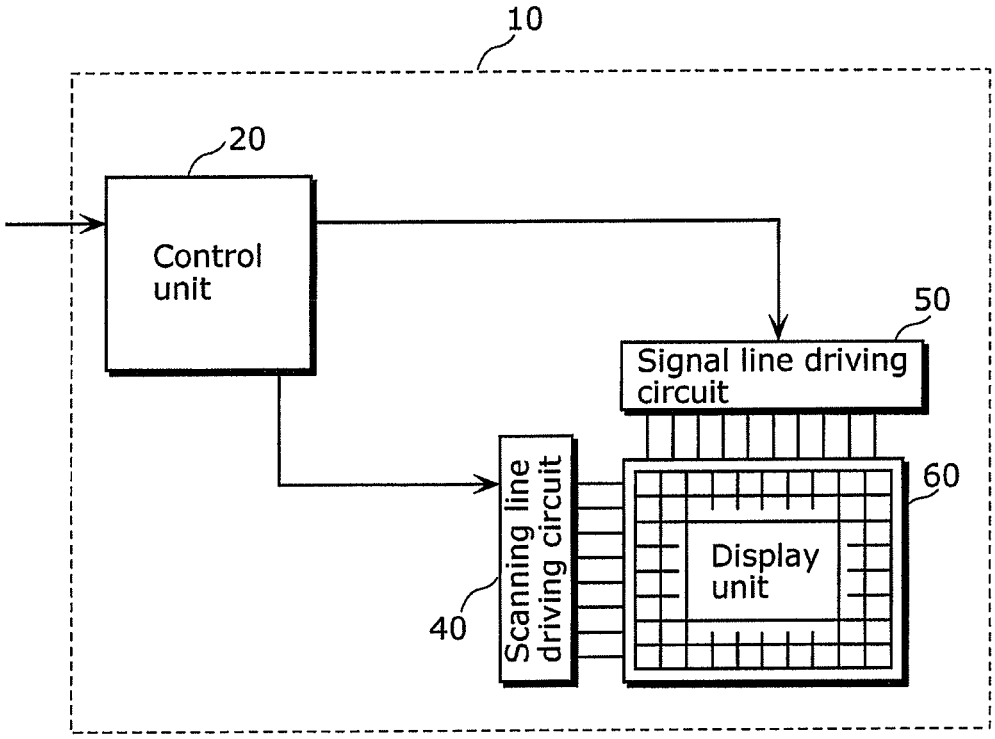
FIG. 2 is a block diagram showing an example structure of a luminescent display device according to Embodiment 1.

FIG. 2 is a block diagram showing an electrical structure of a luminescent display device 10 according to Embodiment 1. The luminescent display device 10 in FIG. 2 at least includes a control circuit 20, a scanning line driving circuit 40, a signal line driving circuit 50, and a display unit 60.

Figure 3:
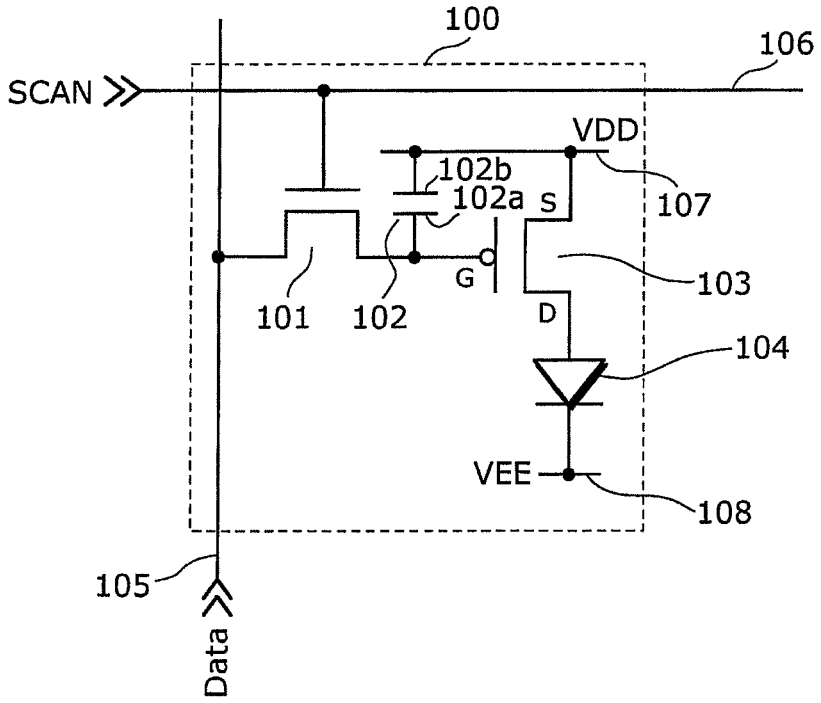
FIG. 3 shows a circuit structure of a luminescent pixel included in a display unit according to Embodiment 1.

FIG. 3 shows a circuit structure of a luminescent pixel 100 included in the display unit 60 according to Embodiment 1. The luminescent pixel 100 in FIG. 3 includes a switching transistor 101, a capacitor 102, a driving transistor 103, an organic EL element 104, a signal line 105, a scanning line 106, a higher-voltage-side power line 107, and a lower-voltage-side power line 108.

First, the following describes the connection relationships and functions of the structural elements shown in FIG. 2.

The control circuit 20 has a function to control the scanning line driving circuit 40 and the signal line driving circuit 50. The control circuit 20 outputs a video signal received from outside, to the signal line driving circuit 50, and controls the operational timing of the scanning line driving circuit 40 according to the operation of the signal line driving circuit 50.

The scanning line driving circuit 40 is connected to the scanning line 106, and has a function to output a scan signal to the scanning line 106 to control between the conductive state (ON state) and the non-conductive state (OFF state) of the switching transistor 101 included in the luminescent pixel 100.

The signal line driving circuit 50 is connected to the signal line 105, and has a function to apply, to the luminescent pixel 100, a signal voltage based on a video signal.

The display unit 60 includes a plurality of luminescent pixels 100 which are two-dimensionally arranged, and displays an image based on the video signal input to the luminescent display device 10 from outside.

Next, the following describes the connection relationships and functions of the structural elements shown in FIG. 3.

The switching transistor 101 is an example of a switching element in which the gate is connected to the scanning line 106, one of the source and the drain is connected to the signal line 105, and the other one of the source and the drain is connected to a capacitor electrode 102a of the capacitor 102. The switching transistor 101 has a function to determine timing of applying the signal voltage at the signal line 105 to the capacitor electrode 102a of the capacitor 102. The switching transistor 101 is, for example, an n-type thin-film transistor (n-type TFT), but may be a p-type TFT.

The capacitor 102 is an example of the first capacitor and includes two capacitor electrodes 102a and 102b. The capacitor electrode 102a is connected to the gate of the driving transistor 103, whereas the capacitor electrode 102b is connected to the higher-voltage-side power line 107. The capacitor 102 holds a charge corresponding to the signal voltage supplied from the signal line 105. In other words, the capacitor 102 is an example of a capacitive element used for setting a value of a driving current supplied to the organic EL element 104. For example, the capacitor 102 has a function to cause the driving transistor 103 to supply the driving current to the organic EL element 104 even when the switching transistor 101 is switched to the OFF state, until another signal voltage is applied.

The driving transistor 103 is an example of a driving element in which the source is connected to the higher-voltage-side power line 107 and the drain is connected to the anode of the organic EL element 104. The driving transistor 103 coverts a voltage corresponding to a signal voltage applied between the gate and the source into a source-drain current corresponding to the applied signal voltage. The driving transistor 103 then supplies the source-drain current to the organic EL element 104 as the driving current. The driving transistor 103 is a p-type thin-film transistor (p-type TFT), for example.

The organic EL element 104 is an example of a luminescent element which is driven to produce luminescence by a driving circuit which includes a thin-film transistor such as the driving transistor 103. In the organic EL element 104, the anode is connected to the drain of the driving transistor 103, and the cathode is connected to the lower-voltage-side power line 108. The organic EL element 104 produces luminescence when the driving transistor 103 passes the driving circuit through the organic EL element 104. The luminescence intensity is controlled by a magnitude of the driving current; in other words, the signal voltage.

The signal line 105 is connected to the signal line driving circuit 50 and to each of luminescent pixels in the pixel column that includes the luminescent pixel 100, and has a function to supply a signal voltage that determines the luminescence intensity. It is to be noted that the luminescent display device 10 includes the same number of signal lines 105 as the number of pixel columns.

The scanning line 106 is connected to the scanning line driving circuit 40 and to each of luminescent pixels in the pixel row that includes the luminescent pixel 100. With this, the scanning line 106 has a function to supply a signal indicating timing of applying the signal voltage to each of the luminescent pixels in the pixel row that includes the luminescent pixel 100. It is to be noted that the luminescent display device 10 includes the same number of scanning lines 106 as the number of pixel rows.

Although not shown in FIG. 2 or FIG. 3, each of the higher-voltage-side power line 107 and the lower-voltage-side power line 108 is also connected to other luminescent pixels and to a voltage source. The potential difference between a voltage source VDD to which the higher-voltage-side power line 107 is connected and a voltage source VEE to which the lower-voltage-side power line 108 is connected has a magnitude which allows passage of a current which is sufficient to cause the organic EL element 104 to produce luminescence. It is to be noted that the lower-voltage-side power line 108 may be grounded.

As shown in the above structure, the luminescent display device 10 according to Embodiment 1 includes the display unit 60 in which a plurality of luminescent pixels 100 are two-dimensionally arranged. The display unit 60 displays video as the organic EL elements 104 in the luminescent pixels 100 produce luminescence at the luminescence intensity according to the signal voltages.

The following describes the positional relationships between the elements included in the luminescent pixel 100 according to Embodiment 1.

Figure 4:
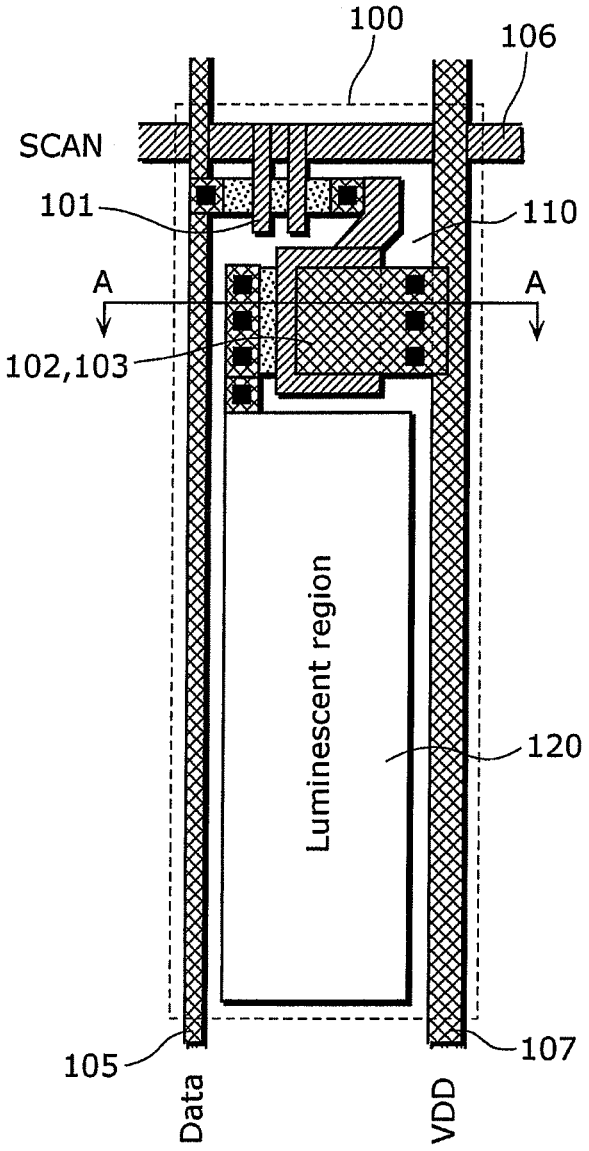
FIG. 4 shows an example layout of a luminescent pixel according to Embodiment 1.

FIG. 4 shows an example layout of the luminescent pixel 100 according to Embodiment 1.

As shown in FIG. 4, the luminescent pixel 100 can be separated into a driving circuit region 110 and a luminescent region 120. In the luminescent region 120, the organic EL element 104 is formed which produces luminescence according to the signal voltage supplied from the signal line 105. It is to be noted that the luminescent display device 10 according to Embodiment 1 is assumed as a bottom-emission luminescent display device. To be more specific, luminescence produced by the organic EL element 104 is directed toward the bottom surface of the substrate. In other words, the display surface of the display unit 60 is on the bottom surface side of the substrate.

The driving circuit region 110 is the region of the luminescent pixel 100 excluding the luminescent region 120, and is a region in which the driving circuit driving the organic EL element 104 is formed. In the driving circuit region 110, the switching transistor 101, the capacitor 102, and the driving transistor 103 are formed.

Figure 5:
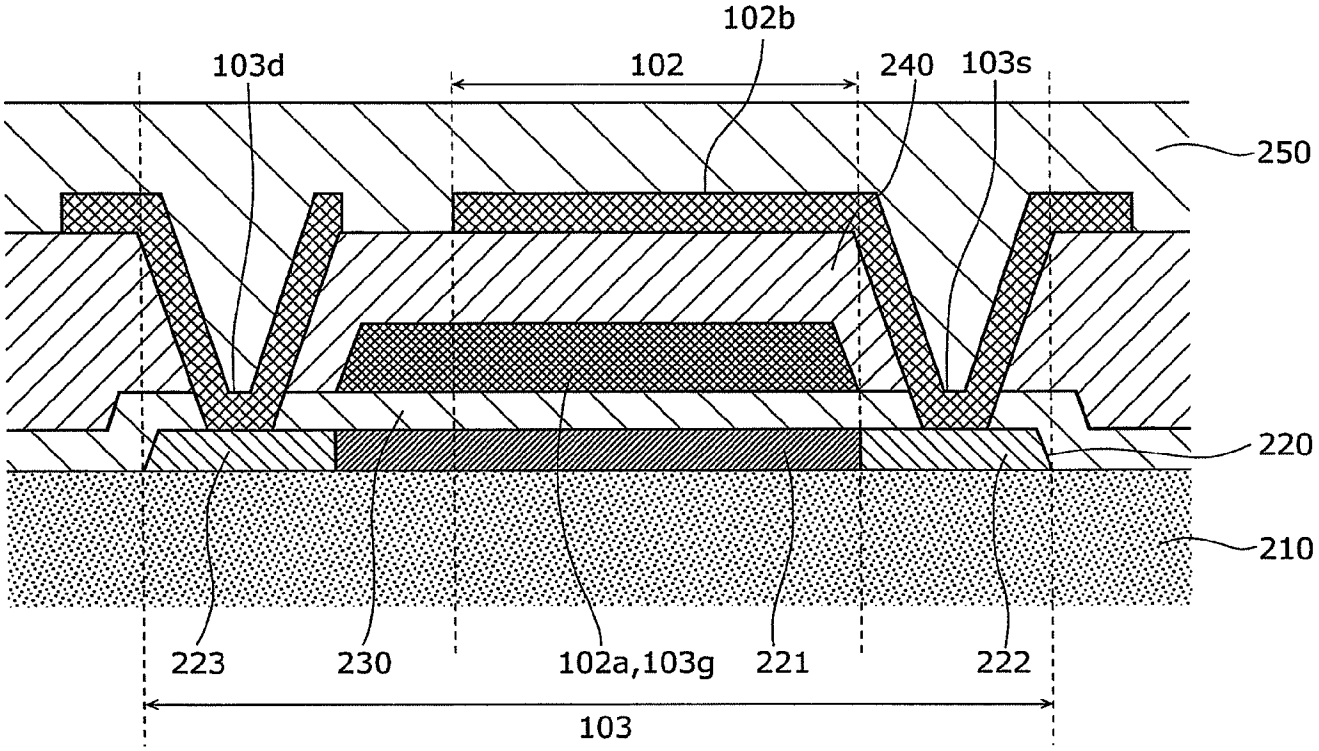
FIG. 5 shows a cross-sectional view of a luminescent pixel according to Embodiment 1.

FIG. 5 shows a cross-sectional view of the luminescent pixel 100 according to Embodiment 1. More specifically, FIG. 5 schematically shows a cross section A-A of the luminescent pixel 100 shown in FIG. 4. The cross section A-A is a cross section showing the positional relationship between the capacitor 102 and the driving transistor 103. For simplicity, FIG. 5 does not show the signal line 105 and the higher-voltage-side power line 107.

As shown in FIG. 5, the driving transistor 103 is formed on a substrate 210. The driving transistor 103 includes a semiconductor layer 220, a gate insulating film 230, a gate electrode 103g, a source electrode 103s, and a drain electrode 103d. Further, the capacitor 102 includes the capacitor electrode 102b, an interlayer insulating film 240, and the capacitor electrode 102a which functions also as the gate electrode 103g. Further, a planarizing film 250 is formed on the capacitor 102.

The substrate 210 is, for example, a transparent substrate such as glass or quartz. The substrate 210 may be a flexible substrate such as a plastic. In the case of a top-emission luminescent display device, the substrate 210 may be a semiconductor substrate such as a silicon substrate, or a compound semiconductor substrate made with a compound semiconductor such as a nitride semiconductor.

Although it has been described above that the driving transistor 103 is formed on the substrate 210, it may be formed above the substrate 210. For example, a buffer layer may be formed on the substrate 210 and the driving transistor 103 may be formed on the buffer layer.

The semiconductor layer 220 is a semiconductor layer formed on the substrate 210 and includes a channel region 221, a source region 222, and a drain region 223. For example, the semiconductor layer 220 is made with a doped inorganic semiconductor such as polysilicon, microcrystalline silicon, or amorphous silicon, or an organic semiconductor.

It is to be noted that the driving transistor 103 is a p-type TFT, and thus, holes mainly contribute to the conduction in the channel region 221. That is to say, the above-described driving current flows as the holes move from the source region 222 to the drain region 223 according to voltages applied to the source electrode 103s, the drain electrode 103d, and the gate electrode 103g.

The gate insulating film 230 is, for example, a film having insulating properties, such as a silicon oxide film ($SiO_x$). In the example shown in FIG. 5, the gate insulating film 230 is formed on the entire surface of the substrate 210 to cover the semiconductor layer 220, and through-holes are formed in the regions above the source region 222 and the drain region 223. The gate insulating film 230 is sufficient as long as it is formed on the channel region 221 at least.

The gate electrode 103g is a metal electrode formed on the gate insulating film 230. For example, the gate electrode 103g has a single-layer structure of a metal such as molybdenum or tungsten, an alloy of molybdenum and tungsten, or polysilicon, or has a laminated structure of polysilicon, and titanium and tungsten, or the like. It is to be noted that the gate electrode 103g is connected to the source or drain of the switching transistor 101 (not shown in FIG. 5). The most significant feature of the present invention is that the gate electrode 103g also functions as the capacitor electrode 102a of the capacitor 102.

The source electrode 103s is formed on the source region 222, and is made of a metal such as aluminum or copper or has a laminated structure of metals such as aluminum and molybdenum, for example. The source electrode 103s is connected to the higher-voltage-side power line 107 (not shown in FIG. 5). Further, as shown in FIG. 5, the source electrode 103s is connected to the capacitor electrode 102b of the capacitor 102 via the through-hole formed in the interlayer insulating film 240 and in the gate insulating film 230.

The drain electrode 103d is formed on the drain region 223, and is made of a metal such as aluminum or has a laminated structure of metals such as aluminum and molybdenum, for example. The drain electrode 103d is connected to the anode of the organic EL element 104 (not shown in FIG. 5).

The interlayer insulating film 240 is formed on the gate electrode 103g and is made with, for example, a silicon nitride film ($SiN_x$), a silicon oxide film, or the like. In the example shown in FIG. 5, the interlayer insulating film 240 is formed on the entire surface of the gate insulating film 230 to cover the gate electrode 103g, and through-holes are formed in the regions above the source region 222 and the drain region 223. The interlayer insulating film 240 is sufficient as long as it is formed on the gate electrode 103g at least.

It is to be noted that the thickness of the interlayer insulating film 240 is 100 to 1000 nm.

The capacitor electrode 102b is an example of the first capacitor electrode and is formed on the interlayer insulating film 240 above the gate electrode 103g. Put it differently, the capacitor electrode 102b is formed on the interlayer insulating film 240 in the region above the gate electrode 103g. The capacitor electrode 102b, together with the gate electrode 103g that is the other capacitor electrode 102a, constitutes the capacitor 102. For example, the capacitor electrode 102b is made of a metal such as aluminum or copper, or has a laminated structure of metals such as aluminum and molybdenum. In this example, the capacitor electrode 102b is connected to the higher-voltage-side power line 107.

Further, the capacitor electrode 102b and the source electrode 103s form one layer and are connected to each other. More specifically, the capacitor electrode 102b is connected to the source electrode 103s via the through-hole formed in the interlayer insulating film 240. Preferably, the capacitor electrode 102b is made of the same material as that of the source electrode 103s. This makes it possible to form the capacitor electrode 102b and the source electrode 103s in the same process, thereby achieving reduction in the number of processes.

The area of the lower surface of the capacitor electrode 102b in the region above the gate electrode 103g, which is the capacitor electrode 102a, is 30% to 100% of the area of the upper surface of the gate electrode 103g. It is to be noted that the capacitor electrode 102b may be larger than the gate electrode 103g. Further, the capacitance of the capacitor 102 is 0.1 to 10 pF.

The planarizing film 250 is formed on the capacitor 102, and functions as a protection film which protects the capacitor 102 and the driving transistor 103 and also functions as a planarizing film which planarizes the upper surfaces of the capacitor 102 and the driving transistor 103. The planarizing film 250 is made with, for example, a silicon oxide film ($SiO_x$), a silicon nitride film ($SiN_x$), or the like.

As shown in the above structure, the capacitor 102 uses the gate electrode 103g as one of the capacitor electrodes. In other words, the capacitor 102 having the gate electrode 103g as the capacitor electrode 102a is formed in the region above the driving transistor 103.

As shown in FIG. 4, this makes it possible to form the capacitor 102 without a region, in the luminescent pixel 100, dedicated to the capacitor 102. Therefore, it is possible to relatively flexibly design the area of the capacitor 102 or design the arrangement of the driving transistor 103 and the switching transistor 101. Alternatively, another capacitor can be added to the driving circuit region 110. As described above, with the luminescent display device 10 according to Embodiment 1, it is possible to increase the design flexibility. With this, for example, since the luminescent display device 10 according to Embodiment 1 is a bottom-emission luminescent display device, it is possible to ensure a wide area for the luminescent region 120, reduce the density of the current flowing in the organic EL element 104, and ensure a longer luminescence lifetime for the luminescent display device 10.

It is to be noted that the structure in which the capacitor is formed above the driving transistor 103 as shown in the present embodiment can be applied to a driving circuit other than the circuit shown in FIG. 3. More specifically, the structure according to the present embodiment can be applied to a driving circuit having a circuit structure in which the gate of the driving transistor 103 is electrically connected to one of two capacitor electrodes constituting the capacitor. The following describes some variations with reference to the drawings.

(Variation 1)

Figure 6:
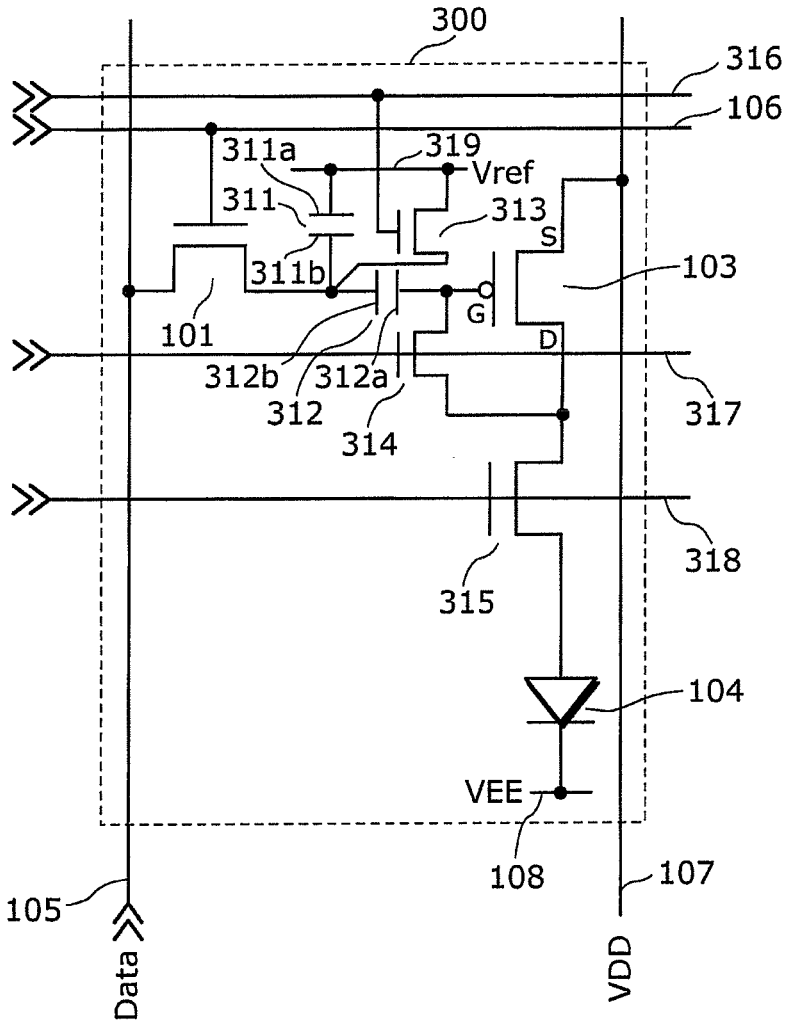
FIG. 6 shows a circuit structure of a luminescent pixel according to a variation of Embodiment 1.

FIG. 6 shows a circuit structure of a luminescent pixel 300 according to a variation of Embodiment 1. The luminescent pixel 300 shown in FIG. 6 includes switching transistors 101, 313, 314 and 315, the driving transistor 103, capacitors 311 and 312, the organic EL element 104, the signal line 105, scanning lines 106, 316, 317 and 318, the higher-voltage-side power line 107, the lower-voltage-side power line 108, and a reference voltage power line 319. It is to be noted that the same structural elements as that of the luminescent pixel 100 shown in FIG. 3 are given the same reference signs and the descriptions thereof are omitted below.

The switching transistor 313 is an example of a switching element in which the gate is connected to the scanning line 316, one of the source and the drain is connected to the reference voltage power line 319, and the other one of the source and the drain is connected to one of the source and the drain of the switching transistor 101. The switching transistor 313 has a function to initialize the gate potential of the driving transistor 103, that is, a function to set the gate potential of the driving transistor 103 to a reference potential Vref.

To be more specific, the switching transistor 313 is turned on by a scanning signal supplied from the scanning line 316, and supplies the reference potential Vref to second electrodes of the capacitors. It is to be noted that the switching transistor 313 is an n-type TFT, for example.

The switching transistor 314 is an example of a switching element in which the gate is connected to the scanning line 317, one of the source and the drain is connected to the gate of the driving transistor 103, and the other one of the source and the drain is connected to the drain of the driving transistor 103. The switching transistor 314 has a function to detect a threshold voltage of the driving transistor 103.

More specifically, for example, the switching transistor 314 is turned on by a scanning signal supplied from the scanning line 317, and short-circuits the gate and the drain of the driving transistor 103. Accordingly, the threshold voltage of the driving transistor 103 is generated at the gate electrode of the driving transistor 103. The switching transistor 314 is an n-type TFT, for example.

The switching transistor 315 is an example of a switching element in which the gate is connected to the scanning line 318, one of the source and the drain is connected to the drain of the driving transistor 103, and the other one of the source and the drain is connected to the anode of the organic EL element 104. The switching transistor 315 has a function to determine timing of supplying the driving current to the organic EL element 104.

More specifically, for example, the switching transistor 315 is turned on by a scanning signal supplied from the scanning line 318, and when the driving transistor 103 is turned on while the switching transistor 315 is on, the driving current is supplied to the organic EL element 104. To put it differently, the driving current is not supplied to the organic EL element 104 while the switching transistor 315 is off, regardless of the operation of the driving transistor 103. It is to be noted that the switching transistor 315 is an n-type TFT, for example.

The capacitor 311 includes two capacitor electrodes 311a and 311b. The capacitor electrode 311a is connected to the reference voltage power line 319, whereas the capacitor electrode 311b is connected to one of the source and the drain of the switching transistor 101. The capacitor electrode 311b is also connected to the gate of the driving transistor 103 via the capacitor 312. The capacitor 311 holds a charge corresponding to the signal voltage supplied from the signal line 105.

The capacitor 312 is an example of the first capacitor, and includes two capacitor electrodes 312a and 312b. The capacitor electrode 312b is connected to one of the source and the drain of the switching transistor 101, whereas the capacitor electrode 312a is connected to the gate of the driving transistor 103. The capacitor 312 holds a charge corresponding to the threshold voltage of the driving transistor 103.

The scanning lines 316, 317 and 318 are connected to the scanning line driving circuit 40 and to each of luminescent pixels in the pixel column that includes the luminescent pixel 300. The scanning line 316 has a function to supply a reference voltage for detecting the threshold voltage of the driving transistor 103 which is included in each of the luminescent pixels in the pixel row that includes the luminescent pixel 300.

The scanning line 317 has a function to supply a signal indicating timing of detecting the threshold voltage of the driving transistor 103 which is included in each of the luminescent pixels in the pixel row that includes the luminescent pixel 300. The scanning line 318 has a function to supply: a signal indicating timing of supplying the driving current to the organic EL element 104 which is included in each of the luminescent pixels in the pixel row that includes the luminescent pixel 300; and a signal indicating timing of detecting the threshold voltage of the driving transistor 103.

It is to be noted that the luminescent display device 10 includes the same number of scanning lines 316, 317 and 318 as the number of pixel rows.

The reference voltage power line 319 is also connected to other luminescent pixels and to a voltage source which supplies a predetermined reference voltage. With this, the potential at the reference voltage power line 319 is maintained at the reference potential Vref.

Figure 7:
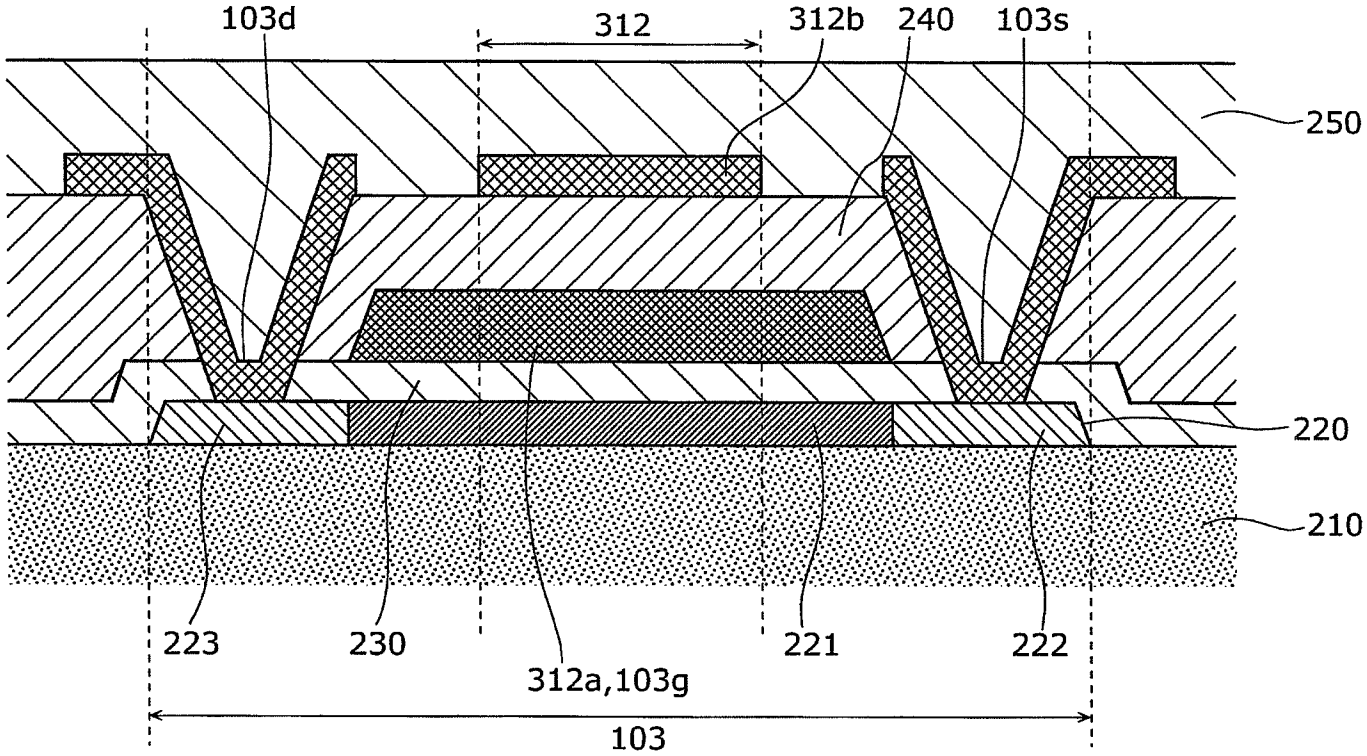
FIG. 7 shows a cross-sectional view of a luminescent pixel according to a variation of Embodiment 1.

FIG. 7 shows a partial cross-sectional view of the luminescent pixel 300 according to Variation 1 of Embodiment 1. Specifically, FIG. 7 shows the structure in which the capacitor 312 and the driving transistor 103 are arranged. It is to be noted that the cross-sectional structure of the driving transistor 103 is the same as the cross-sectional structure shown in FIG. 5, and thus the description thereof is omitted below.

As shown in FIG. 7, the capacitor electrode 312b of the capacitor 312 is formed on the interlayer insulating film 240. The gate electrode 103g functions also as the capacitor electrode 312a of the capacitor 312.

The capacitor electrode 312b is an example of the first capacitor electrode, and is not connected to the source electrode 103s or the drain electrode 103d of the driving transistor 103. The capacitor electrode 312b is connected to one of the source and the drain of the switching transistor 101 and to the capacitor electrode 311b (not shown in FIG. 7).

As described above, the capacitor electrode 312b of the capacitor 311 formed on the driving transistor 103 does not have to be connected to each electrode of the driving transistor 103. That is to say, the structure according to the present embodiment can be applied as long as one of the two electrodes constituting the capacitor is connected to the gate electrode 103g of the driving transistor 103.

(Variation 2)

Figure 8:
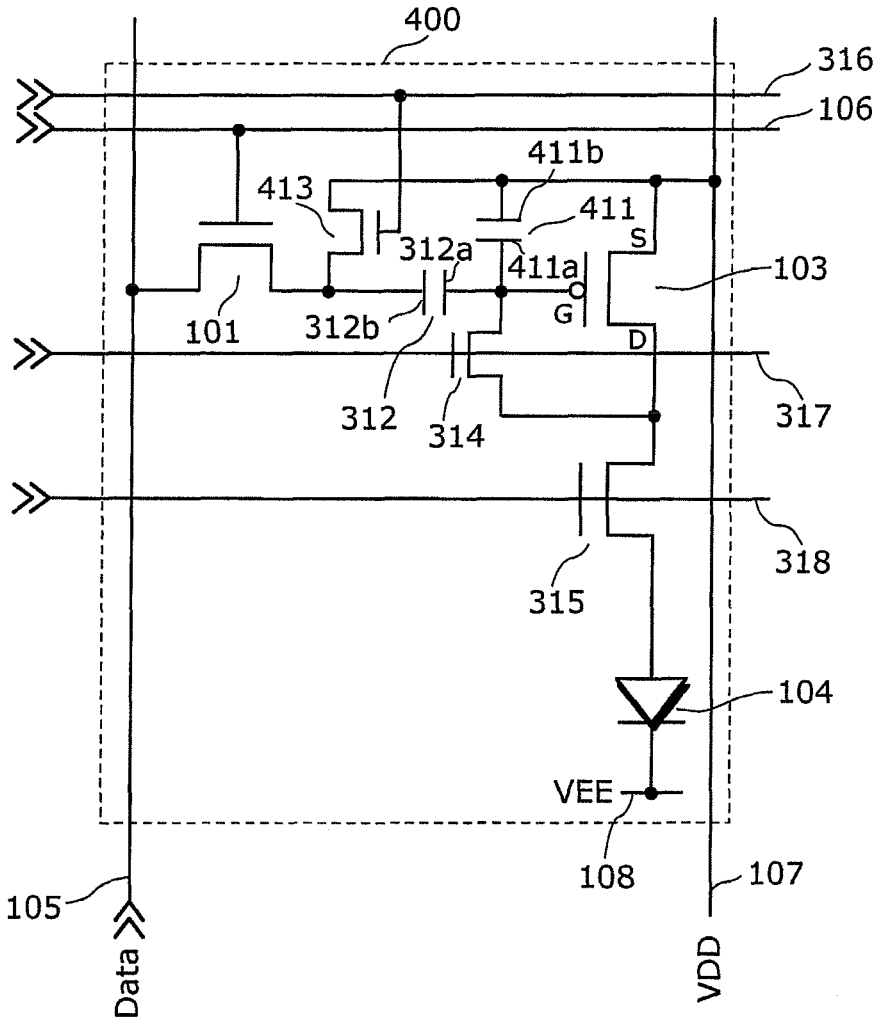
FIG. 8 shows a circuit structure of a luminescent pixel according to another variation of Embodiment 1.

FIG. 8 shows a circuit structure of a luminescent pixel 400 according to another variation of Embodiment 1. The luminescent pixel 400 shown in FIG. 8 is different from the luminescent pixel 300 shown in FIG. 6 in that the luminescent pixel 400 includes a capacitor 411 instead of the capacitor 311 and a switching transistor 413 instead of the switching transistor 313. Hereinafter, the same structural elements as that of the luminescent pixel 300 shown in FIG. 6 are given the same reference signs and the descriptions thereof are omitted below.

The capacitor 411 is an example of the first capacitor, and includes two capacitor electrodes 411a and 411b. The capacitor electrode 411a is connected to the gate electrode 103g of the driving transistor 103, whereas the capacitor electrode 411b is connected to, for example, the higher-voltage-side power line 107. The capacitor 411 holds a charge corresponding to the signal voltage supplied from the signal line 105 and to the threshold voltage of the driving transistor.

The switching transistor 413 is an example of a switching element in which the gate is connected to the scanning line 316, one of the source and the drain is connected to the higher-voltage-side power line 107, and the other one of the source and the drain is connected to one of the source and the drain of the switching transistor 101 and to the capacitor electrode 312b of the capacitor 312. The switching transistor 413 has a function to initialize the capacitor 312 and the capacitor 411.

More specifically, the switching transistor 413 performs the initialization such that the capacitor 312 and the capacitor 411 hold the threshold voltage of the driving transistor 103 when the switching transistor 413 is turned on by a scanning signal supplied from the scanning line 316, the potential at the capacitor electrode 312b of the capacitor 312 is set to VDD, and the switching transistor 314 is turned on by a scanning signal supplied from the scanning line 317. It is to be noted that the switching transistor 413 is an n-type TFT, for example.

Figure 9:
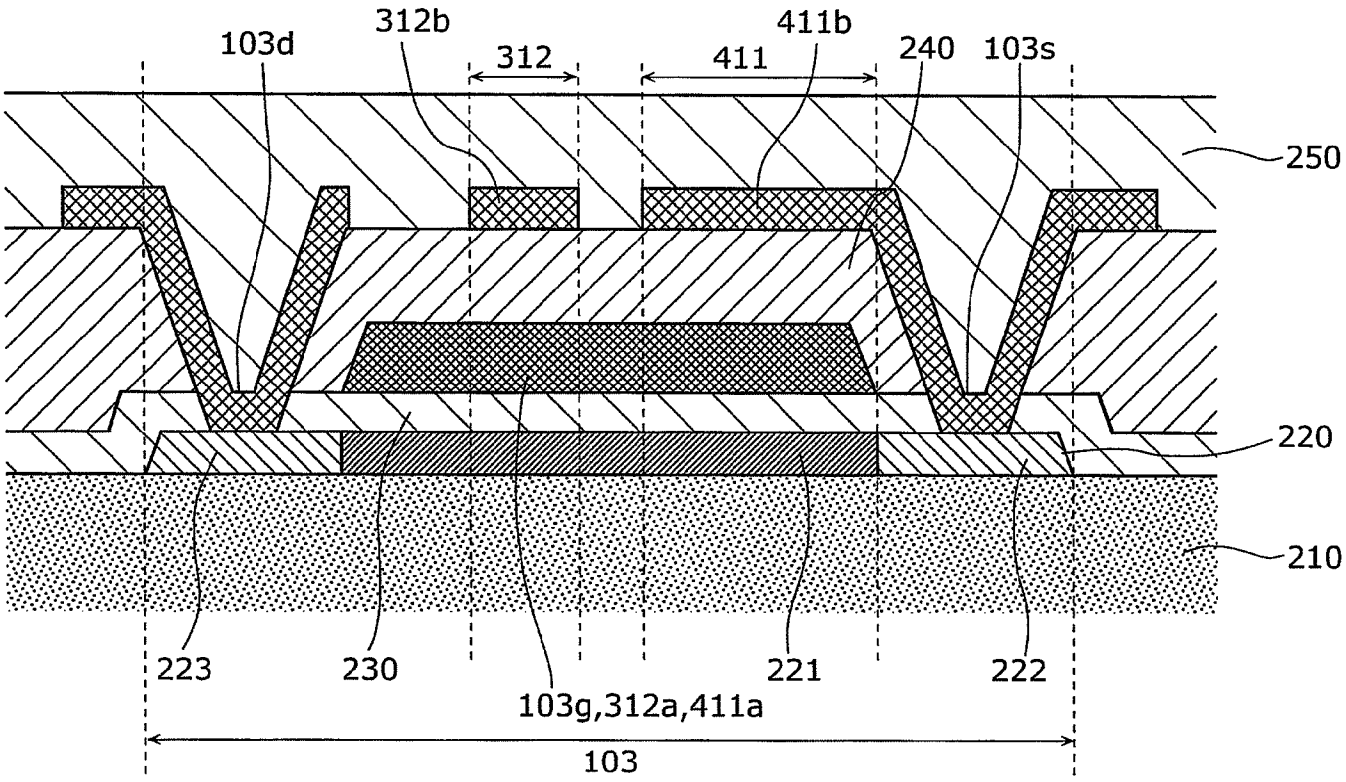
FIG. 9 shows a cross-sectional view of a luminescent pixel according to another variation of Embodiment 1.

FIG. 9 shows a cross-sectional view of the luminescent pixel 400 according to Variation 2 of Embodiment 1. Specifically, FIG. 9 shows the structure in which the capacitor 312, the capacitor 411, and the driving transistor 103 are arranged. It is to be noted that the cross-sectional structure of the driving transistor 103 is the same as the cross-sectional structure shown in FIG. 5, and thus the description thereof is omitted below.

As shown in FIG. 9, the capacitor electrode 312b of the capacitor 312 and the capacitor electrode 411b of the capacitor 411 are formed on the interlayer insulating film 240. The gate electrode 103g functions also as the capacitor electrode 312a of the capacitor 312 and the capacitor electrode 411a of the capacitor 411.

The capacitor electrode 411b is an example of the first capacitor electrode. The capacitor electrode 411b and the source electrode 103s of the driving transistor 103 form one layer and are connected to each other. More specifically, the capacitor electrode 411b is connected to the source electrode 103s via the through-hole formed in the interlayer insulating film 240.

It is to be noted that the capacitor electrode 312b, the capacitor electrode 411b, and the source electrode 103s are preferably made of the same material. This makes it possible to form the capacitor electrode 312b, the capacitor electrode 411b, and the source electrode 103s in the same process, thereby achieving reduction in the number of processes.

As described above, the luminescent display device 10 according to Variation 2 of Embodiment 1 includes a plurality of first capacitor electrodes, and each of the plurality of first capacitor electrodes and the gate electrode 103g constitute the first capacitor. Although the examples shown in FIG. 8 and FIG. 9 have illustrated two first capacitor electrodes, there may be three or more first capacitor electrodes formed on the interlayer insulating film 240 in the region above the gate electrode 103g.

As described above, in the luminescent display device 10 according to Embodiment 1 and the variations thereof, the first capacitor is constituted by the gate electrode 103g of the driving transistor 103 included in the driving circuit and the first capacitor electrode formed above the gate electrode 103g. The first capacitor having such a structure can be used as, for example, a capacitive element for setting a value of the driving current supplied to the organic EL element 104.

This enables efficient use of the limited region within the luminescent pixel 100. That is to say, the design flexibility can be increased. Accordingly, the luminescent display device 10 according to the present embodiment provides an advantageous effect of ensuring a wide region for the luminescent region 120, for example.

It is to be noted that the luminescent display device 10 according to Embodiment 1 may further include a second capacitor which is electrically connected to the capacitor 102 in parallel. For example, the second capacitor includes an upper second capacitor electrode and a lower second capacitor electrode. One of the upper second capacitor electrode and the lower second capacitor electrode is connected to the gate electrode 103g, and the other one is electrically connected to one of the source electrode 103s and the drain electrode 103d.

More specifically, the lower second capacitor electrode and the gate electrode 103g may form one layer, and the upper second capacitor electrode and an electrically-connected one of the source electrode 103s and the drain electrode 103d may form one layer. Here, the capacitor electrode 102a of the capacitor 102 is electrically connected to the upper second capacitor electrode.

Embodiment 2

The luminescent display device according to Embodiment 2 includes a switching transistor, a driving transistor, and a capacitor, and the gate electrode of the switching transistor is one of two capacitor electrodes constituting the capacitor. Thus, the capacitor is formed in the region above the switching transistor.

The luminescent display device according to Embodiment 2 is different from the luminescent display device 10 according to Embodiment 1 in circuit structure of each luminescent pixel included in the display unit and in arrangement of elements constituting each luminescent pixel. In other words, the luminescent display device according to Embodiment 2 has the same electrical structure as that of the luminescent display device 10 according to Embodiment 1 shown in FIG. 2. Thus, the description of the electrical structure of the luminescent display device according to Embodiment 2 is omitted, and the following description centers on the circuit structure of each luminescent pixel and on the arrangement of the elements constituting each luminescent pixel.

Figure 10:
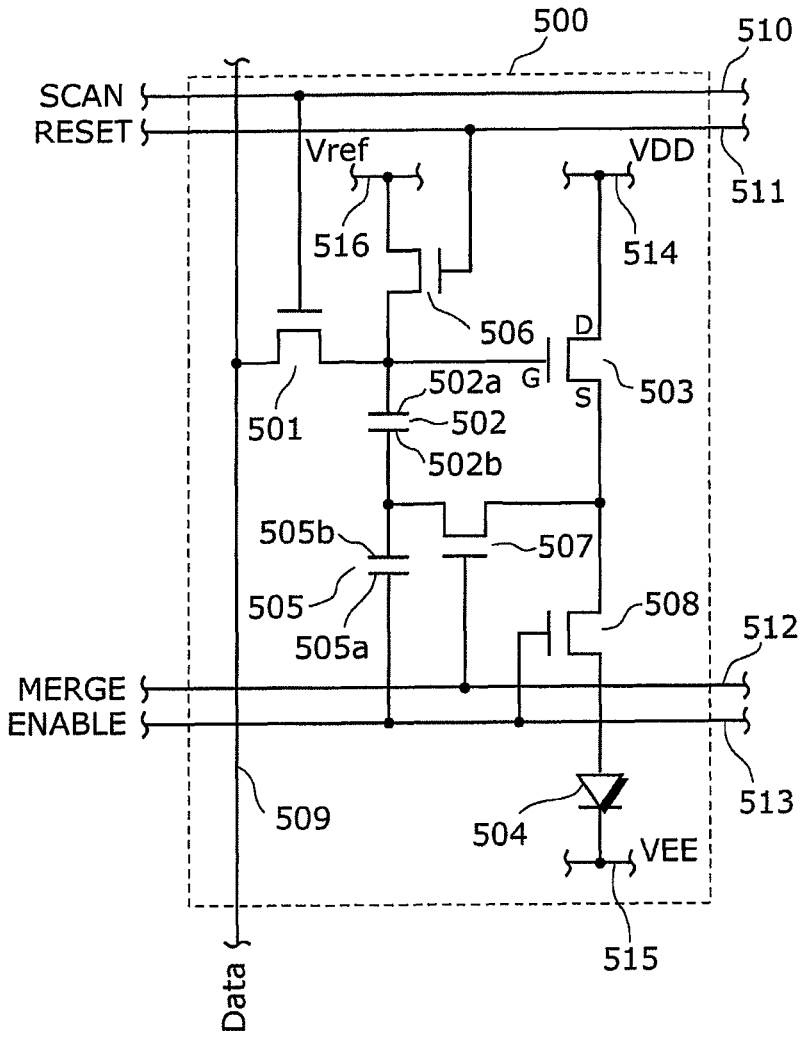
FIG. 10 shows a circuit structure of a luminescent pixel included in a display unit according to Embodiment 2.

FIG. 10 shows a circuit structure of a luminescent pixel 500 included in a display unit according to Embodiment 2. The luminescent pixel 500 in FIG. 10 includes switching transistors 501, 506, 507 and 508, capacitors 502 and 505, a driving transistor 503, an organic EL element 504, a signal line 509, scanning lines 510, 511, 512 and 513, a higher-voltage-side power line 514, a lower-voltage-side power line 515, and a reference voltage power line 516.

The switching transistor 501 is an example of a switching element in which the gate is connected to the scanning line 510, one of the source and the drain is connected to the signal line 509, and the other one of the source and the drain is connected to a capacitor electrode 502a of the capacitor 502 and to the gate of the driving transistor 503. The switching transistor 501 has a function to determine timing of applying a signal voltage at the signal line 509 to the capacitor electrode 502a of the capacitor 502. The switching transistor 501 is an n-type TFT, for example.

The capacitor 502 is an example of the first capacitor corresponding to the driving transistor 503, and includes two capacitor electrodes 502a and 502b. The capacitor electrode 502a is connected to the gate of the driving transistor 503, whereas the capacitor electrode 502b is connected to a capacitor electrode 505b of the capacitor 505 and to the source or drain of the switching transistor 507. The capacitor 502 holds a charge corresponding to the signal voltage supplied from the signal line 509 and to a threshold voltage of the driving transistor 503. In other words, the capacitor 502 is an example of a capacitive element for setting a value of a driving current supplied to the organic EL element 504.

The driving transistor 503 is an example of a driving element in which the drain is connected to the higher-voltage-side power line 514, and the source is connected to the anode of the organic EL element 504 via the switching transistor 508. The driving transistor 503 coverts a voltage corresponding to a signal voltage applied between the gate and the source into a source-drain current corresponding to that signal voltage. The driving transistor 503 is an n-type TFT, for example.

The organic EL element 504 is an example of a luminescent element in which the anode is connected to the source of the driving transistor 503 via the switching transistor 508, and the cathode is connected to the lower-voltage-side power line 515. The organic EL element 504 produces luminescence when the driving transistor 503 passes the driving circuit through the organic EL element 504.

The capacitor 505 is an example of the first capacitor corresponding to the switching transistor 508, and includes two capacitor electrodes 505a and 505b. The capacitor electrode 505a is connected to the scanning line 513, whereas the capacitor electrode 505b is connected to the capacitor electrode 502b and to one of the source and the drain of the switching transistor 507. The capacitor 505 is an example of a capacitive element for adjusting the amount of voltage held by the capacitor 502 which is a capacitive element which holds a data voltage applied from the signal line 509.

The switching transistor 506 is an example of a switching element in which the gate is connected to the scanning line 511, one of the source and the drain is connected to the reference voltage power line 516, and the other one of the source and the drain is connected to the gate of the driving transistor 503. The switching transistor 506 has a function to apply a reference voltage Vref to the gate of the driving transistor 503. It is to be noted that the switching transistor 506 is an n-type TFT, for example.

The switching transistor 507 is an example of a switching element in which the gate is connected to the scanning line 512, one of the source and the drain is connected to the capacitor electrode 502b of the capacitor 502, and the other one of the source and the drain is connected to the source of the driving transistor 503. The switching transistor 507 has a function to disconnect the capacitor 502 and the source of the driving transistor 503 when applying a signal voltage to the capacitor 502. It is to be noted that the switching transistor 507 is an n-type TFT, for example.

The switching transistor 508 is an example of a switching element in which the gate is connected to the scanning line 513, one of the source and the drain is connected to the source of the driving transistor 503, and the other one of the source and the drain is connected to the anode of the organic EL element 504. The switching transistor 508 has a function to determine timing of supplying the driving current to the organic EL element 504. It is to be noted that the switching transistor 508 is an n-type TFT, for example.

The signal line 509 is connected to the signal line driving circuit and to each of luminescent pixels in the pixel column that includes the luminescent pixel 500, and has a function to supply a signal voltage that determines the luminescence intensity. It is to be noted that the luminescent display device according to Embodiment 2 includes the same number of signal lines 509 as the number of pixel columns.

The scanning lines 510, 511, 512 and 513 are connected to the scanning line driving circuit and to each of luminescent pixels in the pixel row that includes the luminescent pixel 500. The scanning line 510 has a function to supply a signal indicating timing of applying the signal voltage to each of the luminescent pixels in the pixel row that includes the luminescent pixel 500.

The scanning line 511 has a function to supply a signal indicating timing of applying a reference voltage Vref to the gate of the driving transistor 503 in each of the luminescent pixels in the pixel row that includes the luminescent pixel 500. The scanning line 512 has a function to supply a signal indicating timing of disconnecting the capacitor 502 and the source of the driving transistor 503 in each of the luminescent pixels in the pixel row that includes the luminescent pixel 500. The scanning line 513 has a function to supply a signal indicating timing of supplying the driving current to the organic EL element 504 in each of the luminescent pixels in the pixel row that includes the luminescent pixel 500.

It is to be noted that the luminescent display device according to Embodiment 2 includes the same number of scanning lines 510, 511, 512 and 513 as the number of pixel rows.

Although not shown in FIG. 10, the higher-voltage-side power line 514, the lower-voltage-side power line 515, and the reference voltage power line 516 are each connected to other luminescent pixels and to a voltage source. The potential difference between the voltage source to which the higher-voltage-side power line 514 is connected and the voltage source to which the lower-voltage-side power line 515 is connected has a magnitude which allows a flow of a current sufficient for the organic EL element 504 to produce luminescence. It is to be noted that the lower-voltage-side power line 515 may be grounded.

Figure 11:
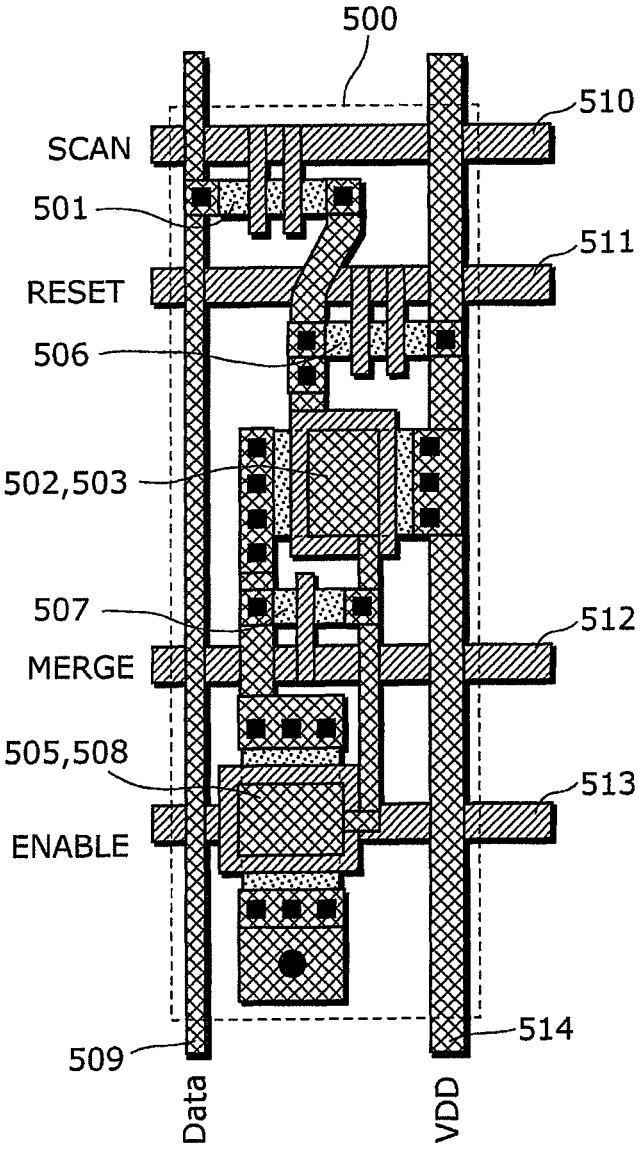
FIG. 11 shows an example layout of a luminescent pixel according to Embodiment 2.

FIG. 11 shows an example layout of the luminescent pixel 500 according to Embodiment 2. The luminescent display device according to Embodiment 2 is assumed as a top-emission luminescent display device. To be more specific, the luminescence produced by the organic EL element 504 is directed toward the top surface of the substrate. In other words, the display surface of the display unit is on the top surface side of the substrate.

In the luminescent pixel 500, the luminescent region in which the organic EL element 504 is formed is the same as the driving circuit region. That is to say, the luminescent region is formed above the driving circuit region.

As shown in FIG. 11, the driving transistor 503 and the capacitor 502 are formed in the same region in the plane to overlap each other, and the switching transistor 508 and the capacitor 505 are formed in the same region in the plane to overlap each other. The structure according to the present embodiment can be applied to such a circuit structure as above in which the gate of a thin-film transistor such as the driving transistor 503 or the switching transistor 508 is electrically connected with a capacitor electrode of a capacitor.

Figure 12:
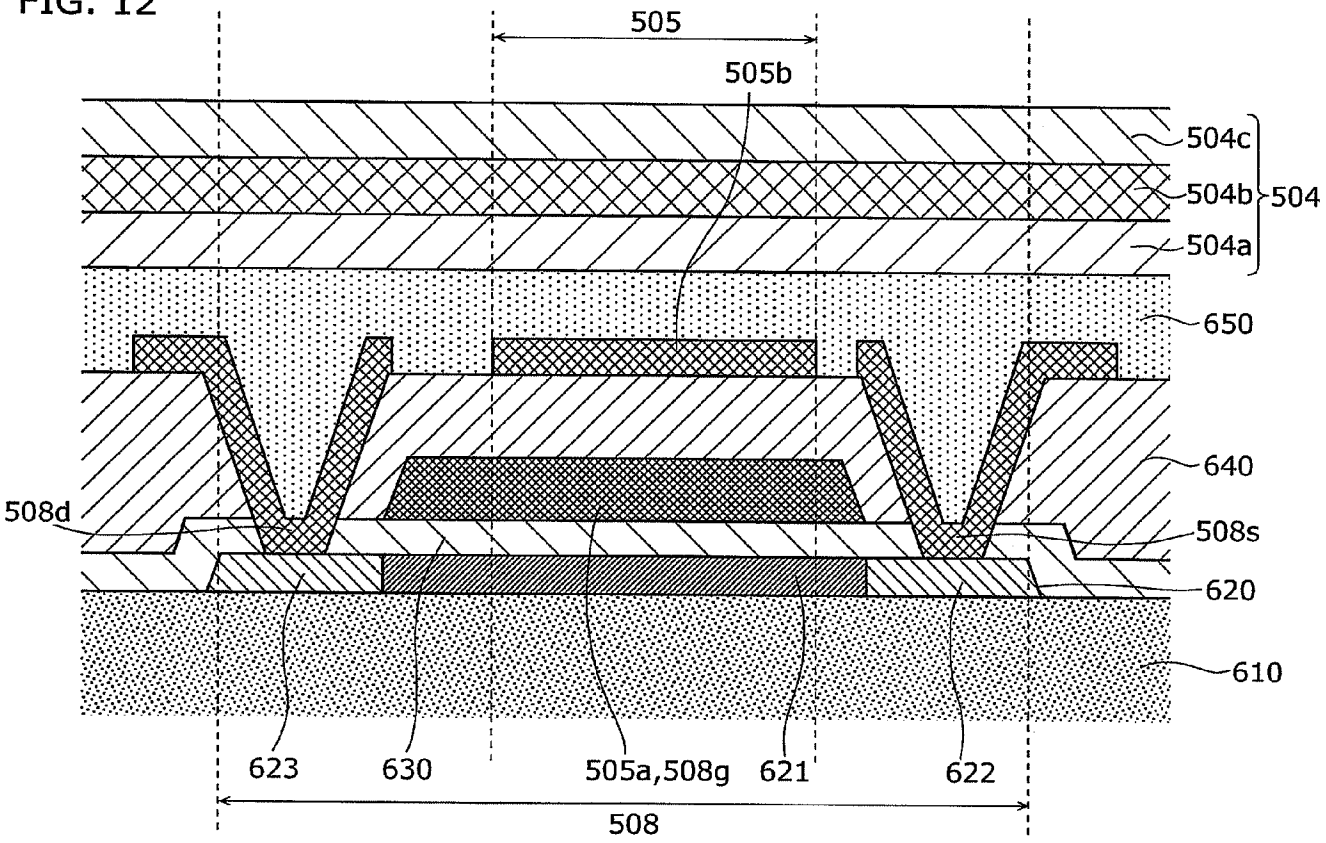
FIG. 12 shows a cross-sectional view of a luminescent pixel according to Embodiment 2.

FIG. 12 shows a cross-sectional view of the luminescent pixel 500 according to Embodiment 2. More specifically, FIG. 12 shows a structure in which the switching transistor 508, the capacitor 505, and the organic EL element 504 are arranged.

It is to be noted that the structure of the switching transistor 508 is the same as that of the driving transistor 103 shown in FIG. 7. To be more specific, a substrate 610, a semiconductor layer 620, a gate insulating film 630, an interlayer insulating film 640, a gate electrode 508g, a source electrode 508s, and a drain electrode 508d which are shown in FIG. 12 correspond to the substrate 210, the semiconductor layer 220, the gate insulating film 230, the interlayer insulating film 240, the gate electrode 103g, the source electrode 103s, and the drain electrode 103d which are shown in FIG. 7, respectively. Further, a channel region 621, a source region 622, and a drain region 623 included in the semiconductor layer 620 correspond to the channel region 221, the source region 222, and the drain region 223 included in the semiconductor layer 220, respectively.

As shown in FIG. 12, the capacitor electrode 505b of the capacitor 505 is an example of the first capacitor electrode, and the capacitor electrode 505b and the source electrode 508s form one layer and are connected to each other. It is to be noted that instead of being connected to the source electrode 508s, the capacitor electrode 505b may be electrically connected to the drain electrode 508d.

Since the luminescent display device according to Embodiment 2 is a top-emission luminescent display device, the organic EL element 504 is formed in a layer above the capacitor 505. More specifically, as shown in FIG. 12, the organic EL element 504 is formed above the capacitor 505 with a planarizing film 650 therebetween. The organic EL element 504 includes an anode 504a, a luminescent layer 504b, and a transparent cathode 504c.

The planarizing film 650 is made with a silicon nitride film, for example.

The anode 504a is a light-reflective electrode and is made of a metal such as aluminum, for example. The anode 504a has a function to reflect luminescence produced by the luminescent layer 504b. The anode 504a is the anode electrode of the organic EL element 504, and is connected to the source of the driving transistor 503 via the switching transistor 508 as shown in FIG. 10.

The luminescent layer 504b is a luminescent layer which is formed between the anode 504a and the transparent cathode 504c which is transparent or semitransparent, and produces luminescence due to recombination of the holes and electrons injected from the anode 504a and the transparent cathode 504c, respectively. It is to be noted that the luminescent layer 504b may include a hole transport layer, a hole injection layer, an electron transport layer, an electron injection layer, and so on.

The transparent cathode 504c is a light-transmissive electrode and is made with a transparent conductive oxide film such as an indium tin oxide (ITO), for example. The transparent cathode 504c is the cathode electrode of the organic EL element 504, and is connected to the lower-voltage-side power line 515 as shown in FIG. 10.

As described above, with the luminescent display device according to Embodiment 2, the capacitor 505 is constituted by the gate electrode 508g of the switching transistor 508 included in the driving circuit and the capacitor electrode 505b formed above the gate electrode 508g. The capacitor 505 having such a structure can be used as, for example, a capacitive element for: initializing a capacitive element for setting the value of the driving current supplied to the organic EL element 504; and adjusting the amount of voltage to be held by the capacitive element out of the data voltage applied from the signal line 509.

Thus, the structure of the present embodiment can be applied to a driving circuit having a circuit structure in which the gate electrode of a switching transistor and one of the capacitor electrodes of a capacitor are electrically connected. As a result, it is possible to reduce the region dedicated to the capacitor, and thus the design flexibility of the driving circuit can be increased.

Although the luminescent display device according to the present invention has been described above based on some exemplary embodiments, the present invention is not intended to be limited to such embodiments. Those skilled in the art may arrive at many modifications to the above exemplary embodiments and at various embodiments implemented by combining the structural elements of different embodiments without materially departing from the novel teachings and advantages of the present invention. Accordingly, all such modifications and embodiments are intended to be included within the scope of the present invention.

For example, the present invention is applicable to a circuit having a circuit structure in which the gate of a thin-film transistor included in a driving circuit is connected with one of the electrodes of a capacitor. Although the above embodiments have described the structure in which the gate of a driving transistor or a switching transistor is connected with one of the electrodes of a capacitor, the circuit structure and so on is not limited to the above description.

Further, the above embodiments have described the switching transistors as the n-type transistors which are turned on when a positive voltage is applied to the gate of the switching transistors. However, the same advantageous effect as that of the above-described embodiments can be provided also by a video display device in which the switching transistors are p-type transistors and the polarity of the scanning lines is reversed. Furthermore, although the above description explained that the lower electrode is the anode and the upper electrode is the cathode, it may surely be that the lower electrode is the cathode and the upper electrode is the anode.

Figure 13:
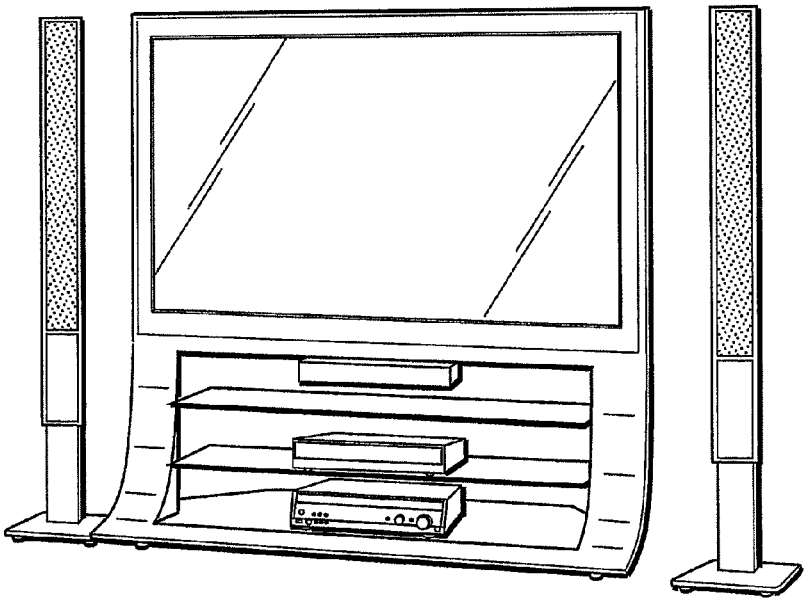
FIG. 13 is an external view of a television set which includes a luminescent display device according to the present invention.

Moreover, for example, the luminescent display device according to the present invention is built in a television set as shown in FIG. 13. With the built-in luminescent display device according to the present invention, it is possible to provide a television set capable of high-precision image display that reflects video signals.

Furthermore, the luminescent display device according to the present invention may include a second capacitor which is electrically connected in parallel with a first capacitor having the gate electrode of a thin-film transistor as the lower electrode as described above.

Figure 14:
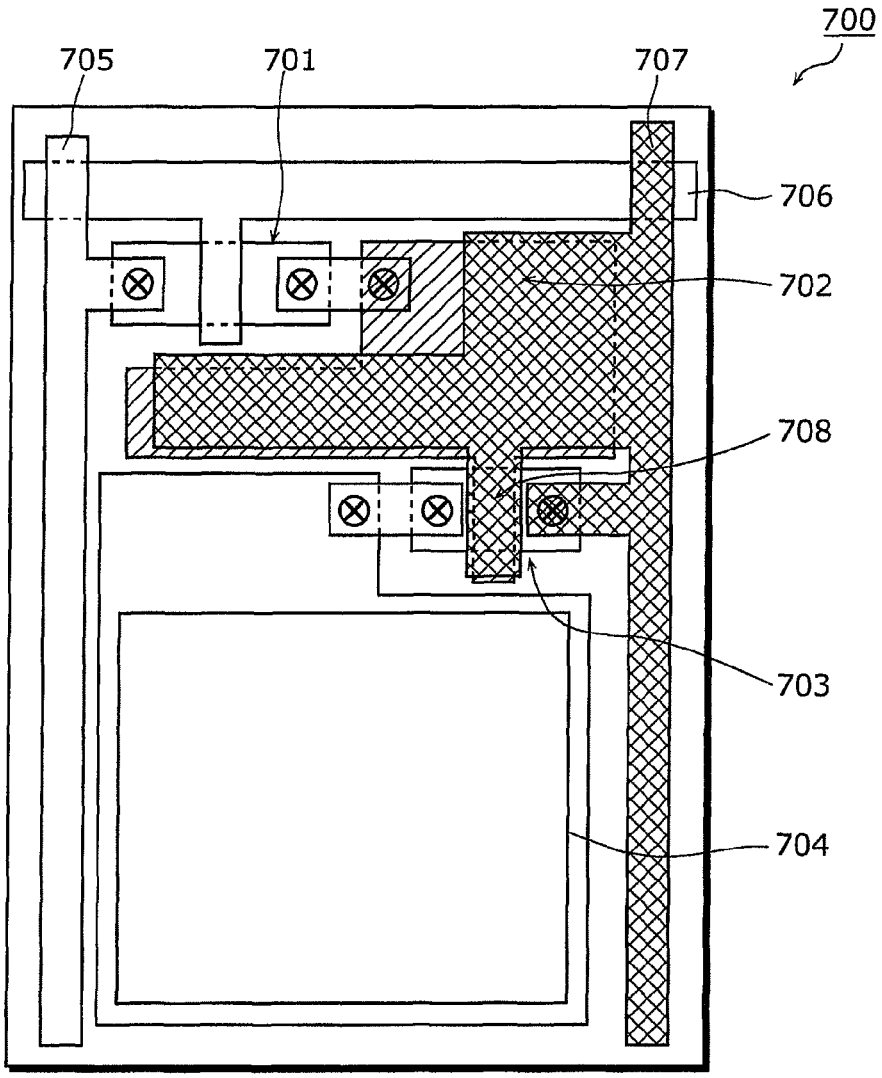
FIG. 14 shows an example layout of a luminescent pixel in another variation of a luminescent display device according to the present invention.

FIG. 14 shows an example layout of a luminescent pixel in another variation of the luminescent display device according to the present invention. In FIG. 14, the same structural elements as that of the conventional luminescent display device shown in FIG. 1 are given the same reference signs and the descriptions thereof are omitted below.

As shown in FIG. 14, the luminescent pixel 700 includes a first capacitor 708 and a capacitor 702 which is a second capacitor. The first capacitor 708 is formed on the driving transistor 703 and includes an upper electrode and a lower electrode. The lower electrode of the first capacitor 708 functions also as the gate electrode of the driving transistor 703. The capacitor 702 which is the second capacitor includes an upper second capacitor electrode and a lower second capacitor electrode.

The upper electrode of the first capacitor 708 is electrically connected to the upper second capacitor electrode of the capacitor 702. More specifically, as shown in FIG. 14, the upper electrode of the first capacitor 708, the upper second capacitor electrode of the capacitor 702, the power line 707, and one of the source electrode and the drain electrode of the driving transistor 703 form one layer, and the upper electrode of the first capacitor 708 is electrically connected to the one of the source electrode and the drain electrode of the driving transistor 703.

The lower electrode of the first capacitor 708 functions as the gate electrode of the driving transistor 703 as described above, and is electrically connected to the lower second capacitor electrode of the capacitor 702. More specifically, as shown in FIG. 14, the lower second capacitor electrode of the capacitor 702 and the gate electrode which is the lower electrode of the first capacitor 708 form one layer and are electrically connected.

The above structure makes it possible to efficiently use the region above the driving transistor 703 and to increase the capacity of the capacitor 702.

INDUSTRIAL APPLICABILITY

The luminescent display device according to the present invention is applicable to various display devices such as television sets, personal computers, and mobile phones.

What is claimed is:

1. A luminescent display device, comprising:

a substrate; and a plurality of pixels above the substrate, each of the pixels including:

a thin film transistor above the substrate, the thin film transistor including:

a semiconductor layer comprising a channel region, a source region, and a drain region;

a source electrode electrically connected to the source region of the semiconductor layer; and a drain electrode electrically connected to the drain region of the semiconductor layer;

a lower electrode above the substrate, the lower electrode including a first portion and a second portion, the first portion of the lower electrode being provided in a region in which the thin film transistor is provided, the first portion of the lower electrode comprising a gate electrode of the thin film transistor, the second portion of the lower electrode being provided in a region other than the region in which the thin-film transistor is provided the lower electrode, including the first portion and the second portion, comprising one continuous layer;

an interlayer insulating film on the lower electrode;

an upper electrode on the interlayer insulating film, the upper electrode including a first portion and a second portion, the upper electrode, including the first portion and the second portion, comprising one continuous layer, the first portion of the upper electrode comprising a capacitor electrode directly above the gate electrode, the first portion of the upper electrode further comprising the source electrode, the capacitor electrode and the source electrode being connected via a through-hole in the interlayer insulating film; and a luminescent element configured to be driven by a driver to produce luminescence, the driver including the thin film transistor, wherein the first portion of the upper electrode and the first portion of the lower electrode comprise a first capacitance, and the second portion of the upper electrode and the second portion of the lower electrode comprise a second capacitance, *and*

*the capacitor electrode extends from the second portion of the upper electrode to be directly above the gate electrode, with the upper electrode including a physical separation that overlaps the semiconductor layer and that is between the capacitor electrode and the source electrode*.

2. The luminescent display device according to claim 1, wherein an area of a lower surface of the first portion of the upper electrode, in the region in which the thin film transistor is provided, is approximately 30% to approximately 100% of an area of an upper surface of the gate electrode.

3. The luminescent display device according to claim 1, wherein the semiconductor layer comprises polysilicon.

4. The luminescent display device according to claim 1, wherein the first capacitance is approximately 0.1 pF to approximately 10 pF.

5. The luminescent display device according to claim 1, wherein the luminescent display device is a top-emission luminescent display device, and the luminescent element is in a layer above the upper electrode.

6. The luminescent display device according to claim 1, wherein the luminescent display device is a bottom-emission luminescent display device, and the thin-film transistor, the lower electrode, and the upper electrode are in a region other than a luminescent region in which the luminescent element is disposed.

7. The luminescent display device according to claim 1, wherein the one continuous layer of the upper electrode includes the source electrode of the thin film transistor.

8. The luminescent display device according to claim 7, further comprising:

a power line connected to the one of the source electrode and the drain electrode of the thin film transistor, wherein the one continuous layer of the upper electrode further includes the power line.

*9. A luminescent display device, comprising:*

*a substrate; and*

*a plurality of pixels above the substrate,*

*each of the pixels including:*

*a thin film transistor above the substrate, the thin film transistor including:*

*a semiconductor layer comprising a channel region, a source region, and a drain region;*

*a source electrode configured to be electrically connected to the source region of the semiconductor layer; and*

*a drain electrode configured to be electrically connected to the drain region of the semiconductor layer;*

*a lower electrode above the substrate, the lower electrode including a first portion and a second portion, the first portion of the lower electrode being provided in a region in which the thin film transistor is provided, the first portion of the lower electrode comprising a gate electrode of the thin film transistor, the second portion of the lower electrode being provided in a region other than the region in which the thin-film transistor is provided, the lower electrode, including the first portion and the second portion, comprising one continuous layer;*

*an interlayer insulating film above the lower electrode;*

*an upper electrode, contacting the interlayer insulating film, which is configured to be electrically connected to one of the source region and the drain region of the semiconductor layer via a through-hole in the interlayer insulating film, the upper electrode including a first portion and a second portion, the upper electrode, including the first portion and the second portion, comprising one continuous layer, the first portion of the upper electrode overlapping the first portion of the lower electrode to form a first capacitance, the second portion of the upper electrode overlapping the second portion of the lower electrode to form a second capacitance; and*

*a luminescent element configured to be driven by a driver to produce luminescence, the driver including the thin film transistor,*

*wherein the first portion of the upper electrode extends from the second portion of the upper electrode to overlap the first portion of the lower electrode to form the first capacitance, with the upper electrode including a physical separation that overlaps the semiconductor layer and that is between the first portion of the upper electrode and a portion of the upper electrode that is configured to be electrically connected to the one of the source region or the drain region.*

*10. The luminescent display device according to claim 9, wherein an area of a lower surface of the first portion of the upper electrode, in the region in which the thin film transistor is provided, is approximately 30% to approximately 100% of an area of an upper surface of the gate electrode.*

*11. The luminescent display device according to claim 9, wherein the semiconductor layer comprises polysilicon.*

*12. The luminescent display device according to claim 9, wherein the first capacitance is approximately 0.1 pF to approximately 10 pF.*

*13. The luminescent display device according to claim 9, wherein the luminescent display device is a top-emission luminescent display device, and the luminescent element is in a layer above the upper electrode.*

*14. The luminescent display device according to claim 9, wherein a part of the upper electrode constitutes one of the source electrode and the drain electrode.*

*15. The luminescent display device according to claim 14, wherein the first portion of the upper electrode, the second portion of the upper electrode, and the part of the upper electrode which constitutes the one of the source electrode and the drain electrode comprise one continuous layer.*

*16. The luminescent display device according to claim 15, wherein the first portion of the upper electrode is connected to the one of the source electrode and the drain electrode via the through-hole in the interlayer insulating film.*

*17. The luminescent display device according to claim 9, wherein the first portion of the upper electrode is configured to be electrically connected to one of the source electrode and the drain electrode.*

*18. The luminescent display device according to claim 17, wherein the first portion of the upper electrode, the second portion of the upper electrode, and the one of the source electrode and the drain electrode comprise one continuous layer.*

*19. The luminescent display device according to claim 18, wherein the first portion of the upper electrode is connected to the source electrode via the through-hole in the interlayer insulating film.*

*20. The luminescent display device according to claim 9, wherein the first portion of the upper electrode, the second portion of the upper electrode, and one of the source electrode and the drain electrode comprise one continuous layer.*

*21. A luminescent display device, comprising:*

*a substrate; and*

*a plurality of pixels above the substrate,*

*each of the pixels including:*

*a driving transistor above the substrate;*

*a semiconductor layer comprising a channel region, a source region, and a drain region;*

*a source electrode configured to be electrically connected to the source region of the semiconductor layer;*

*a drain electrode configured to be electrically connected to the drain region of the semiconductor layer;*

*a lower electrode above the substrate, the lower electrode including a first portion and a second portion, the first portion of the lower electrode being provided in a region in which the driving transistor is provided, the first portion of the lower electrode comprising a gate electrode of the driving transistor,*

*the second portion of the lower electrode being provided in a region other than the region in which the driving transistor is provided, the lower electrode, including the first portion and the second portion, comprising one continuous layer;*

*an interlayer insulating film above the lower electrode;*

*an upper electrode, contacting the interlayer insulating film, which is configured to be electrically connected to one of the source region and the drain region of the semiconductor layer via a through-hole in the interlayer insulating film, the upper electrode including a first portion and a second portion, the upper electrode, including the first portion and the second portion, comprising one continuous layer, the first portion of the upper electrode overlapping the first portion of the lower electrode to form a first capacitance, the second portion of the upper electrode overlapping the second portion of the lower electrode to form a second capacitance; and*

*a luminescent element configured to be driven by a driver to produce luminescence, the driver including the driving transistor,*

*wherein the first portion of the upper electrode extends from the second portion of the upper electrode to overlap the first portion of the lower electrode to form the first capacitance, with the upper electrode including a physical separation that overlaps the semiconductor layer and that is between the first portion of the upper electrode and a portion of the upper electrode that is configured to be electrically connected to the one of the source region or the drain region.*

*22. A luminescent display device, comprising:*

*a substrate; and*

*a plurality of pixels above the substrate,*

*each of the pixels including:*

*a thin film transistor above the substrate, the thin film transistor including:*

*a semiconductor layer comprising a channel region, a source region, and a drain region;*

*a source electrode configured to be electrically connected to the source region of the semiconductor layer; and*

*a drain electrode configured to be electrically connected to the drain region of the semiconductor layer;*

*a lower electrode above the substrate, the lower electrode including a first portion and a second portion, the first portion of the lower electrode being provided in a region in which the thin film transistor is provided, the first portion of the lower electrode comprising a gate electrode of the thin film transistor, the second portion of the lower electrode being provided in a region other than the region in which the thin-film transistor is provided, the lower electrode, including the first portion and the second portion, comprising one continuous layer;*

*an interlayer insulating film above the lower electrode;*

*an upper electrode contacting the interlayer insulating film, the upper electrode including a first portion and a second portion, the upper electrode, including the first portion and the second portion, comprising one continuous layer, the first portion of the upper electrode being above the gate electrode, a part of the upper electrode being connected to the source electrode, the part of the upper electrode and the source electrode being connected via a through-hole in the interlayer insulating film; and*

*a luminescent element configured to be driven by a driver to produce luminescence, the driver including the thin film transistor,*

*wherein the first portion of the upper electrode and the first portion of the lower electrode form a first capacitance in a region corresponding to the channel region,*

*the second portion of the upper electrode and the second portion of the lower electrode form a second capacitance in a region other than the region corresponding to the channel region, and*

*the first portion of the upper electrode extends from the second portion of the upper electrode to be above the gate electrode, with the upper electrode including a physical separation that is above the semiconductor layer and that is between the first portion of the upper electrode and the part of the upper electrode that is connected to the source electrode.*

*23. The luminescent display device according to claim 22, wherein an area of a lower surface of the first portion of the upper electrode, which is above the gate electrode, is approximately 30% to approximately 100% of an area of an upper surface of the gate electrode.*

*24. The luminescent display device according to claim 22, wherein the semiconductor layer comprises polysilicon.*

*25. The luminescent display device according to claim 22, wherein the first capacitance is approximately 0.1 pF to approximately 10 pF.*

*26. The luminescent display device according to claim 22, wherein the luminescent display device is a top-emission luminescent display device, and the luminescent element is in a layer above the upper electrode.*

*27. The luminescent display device according to claim 22, wherein the first portion of the upper electrode, the second portion of the upper electrode, and the source electrode comprise one continuous layer.*

*28. A luminescent display device, comprising:*

*a substrate; and*

*a plurality of pixels above the substrate,*

*each of the pixels including:*

*a driving transistor above the substrate;*

*a semiconductor layer comprising a channel region, a source region, and a drain region;*

*a source electrode configured to be electrically connected to the source region of the semiconductor layer;*

*a drain electrode configured to be electrically connected to the drain region of the semiconductor layer;*

*a lower electrode above the substrate, the lower electrode including a first portion and a second portion, the first portion of the lower electrode being provided in a region in which the driving transistor is provided, the first portion of the lower electrode comprising a gate electrode of the driving transistor, the second portion of the lower electrode being provided in a region other than the region in which the driving transistor is provided, the lower electrode, including the first portion and the second portion, comprising one continuous layer;*

*an interlayer insulating film above the lower electrode;*

*an upper electrode contacting the interlayer insulating film, the upper electrode including a first portion and a second portion, the upper electrode, including the first portion and the second portion, comprising one continuous layer, the first portion of the upper electrode being above the gate electrode, a part of the upper electrode being connected to the source elec-*

*trode, the part of the upper electrode and the source electrode being connected via a through-hole in the interlayer insulating film; and*

*a luminescent element configured to be driven by a driver to produce luminescence, the driver including the driving transistor,*

*wherein the first portion of the upper electrode and the first portion of the lower electrode form a first capacitance in a region corresponding to the channel region,*

*the second portion of the upper electrode and the second portion of the lower electrode form a second capacitance in a region other than the region corresponding to the channel region, and*

*the first portion of the upper electrode extends from the second portion of the upper electrode to be above the gate electrode to form the first capacitance, with the upper electrode including a physical separation that is above the semiconductor layer and that is between the first portion of the upper electrode and the part of the upper electrode that is connected to the source electrode.*

* * * * *